United States Patent
Gruner et al.

(10) Patent No.: US 9,785,054 B2
(45) Date of Patent: Oct. 10, 2017

(54) MIRROR, MORE PARTICULARLY FOR A MICROLITHOGRAPHIC PROJECTION EXPOSURE APPARATUS

(71) Applicant: Carl Zeiss SMT GmbH, Oberkochen (DE)

(72) Inventors: Toralf Gruner, Aalen-Hofen (DE); Kerstin Hild, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/082,555

(22) Filed: Mar. 28, 2016

(65) Prior Publication Data
US 2016/0209751 A1 Jul. 21, 2016

Related U.S. Application Data

(63) Continuation of application No. PCT/EP2014/067538, filed on Aug. 18, 2014.

(30) Foreign Application Priority Data

Sep. 27, 2013 (DE) ........................ 10 2013 219 583

(51) Int. Cl.
*G03F 7/20* (2006.01)
*G21K 1/06* (2006.01)
(Continued)

(52) U.S. Cl.
CPC ........... *G03F 7/702* (2013.01); *G02B 5/0816* (2013.01); *G02B 5/0891* (2013.01);
(Continued)

(58) Field of Classification Search
CPC ..... G02B 5/0816; G02B 5/0891; G03F 7/702; G03F 7/70266; G03F 7/70316;
(Continued)

(56) References Cited

U.S. PATENT DOCUMENTS

2005/0237618 A1* 10/2005 Yamamoto ......... G02B 26/0825
 359/587
2005/0271957 A1 12/2005 Miyachi et al.
(Continued)

FOREIGN PATENT DOCUMENTS

DE 102011005940 A1 9/2012
DE WO 2012126954 A1 * 9/2012 ............. B82Y 10/00
(Continued)

OTHER PUBLICATIONS

International Search Report and Written Opinion in counterpart International Application No. PCT/EP2014/067538, dated Nov. 19, 2014.
(Continued)

*Primary Examiner* — Steven H Whitesell Gordon
(74) *Attorney, Agent, or Firm* — Edell, Shapiro & Finnan, LLC

(57) ABSTRACT

A mirror, in particular for a microlithographic projection exposure apparatus has an optically effective surface (11), a mirror substrate (12), a reflection layer stack (21) for reflecting electromagnetic radiation that is incident on the optical effective surface, and at least two piezoelectric layers (16a, 16b, 16c), which are arranged successively between the mirror substrate and the reflection layer stack in the stack direction of the reflection layer stack and to which an electric field can be applied to produce a locally variable deformation, wherein at least one intermediate layer (22a, 22b) made of crystalline material is arranged between the piezoelectric layers (16a, 16b, 16c), wherein the intermediate layer is designed to leave an electric field, which is present in the region of the piezoelectric layers (16a, 16b, 16c) that adjoin the intermediate layer (22a, 22b) in the stack direction of the reflection layer stack (21), substantially uninfluenced.

20 Claims, 4 Drawing Sheets

(51) Int. Cl.
  *G02B 5/08* (2006.01)
  *H01L 41/08* (2006.01)
  *H01L 41/18* (2006.01)
  *H01L 41/187* (2006.01)
(52) U.S. Cl.
  CPC ...... *G03F 7/70266* (2013.01); *G03F 7/70316* (2013.01); *G21K 1/062* (2013.01); *H01L 41/0805* (2013.01); *H01L 41/183* (2013.01); *H01L 41/1876* (2013.01)
(58) Field of Classification Search
  CPC ... G21K 1/062; H01L 41/0805; H01L 41/183; H01L 41/1876
  See application file for complete search history.

(56) References Cited

U.S. PATENT DOCUMENTS

| | | |
|---|---|---|
| 2008/0165415 A1 | 7/2008 | Chan et al. |
| 2009/0085445 A1 | 4/2009 | Kobayashi et al. |
| 2010/0014143 A1* | 1/2010 | Kanno .................. B81B 3/004 359/224.1 |
| 2014/0240686 A1 | 8/2014 | Ruoff et al. |
| 2014/0285783 A1 | 9/2014 | Dinger et al. |

FOREIGN PATENT DOCUMENTS

| | | |
|---|---|---|
| DE | 102011081603 A1 | 10/2012 |
| DE | 102011086345 A1 | 5/2013 |
| WO | 2005124425 A2 | 12/2005 |

OTHER PUBLICATIONS

International Preliminary Report on Patentability in counterpart International Application No. PCT/EP2014/067538, dated Mar. 29, 2016, along with an English language translation.
Office Action in corresponding German Application No. 102013219583.4, dated Aug. 6, 2014.
English language translation of Office Action in corresponding German Application No. 10 2013 219 583.4, dated Aug. 6, 2014.

* cited by examiner

MIRROR, MORE PARTICULARLY FOR A MICROLITHOGRAPHIC PROJECTION EXPOSURE APPARATUS

CROSS REFERENCE TO RELATED APPLICATIONS

This is a Continuation of International Application PCT/EP2014/067538, which has an international filing date of Aug. 18, 2014, and the disclosure of which is incorporated in its entirety into the present Continuation by reference. The following disclosure is also based on and claims the benefit of and priority under 35 U.S.C. §119(a) to German Patent Application No. DE 10 2013 219 583.4, filed Sep. 27, 2013, which is also incorporated in its entirety into the present Continuation by reference.

FIELD OF THE INVENTION

The invention relates to a mirror, in particular for a microlithographic projection exposure apparatus.

BACKGROUND

Microlithography is used for producing microstructured components, such as for example integrated circuits or LCDs. The microlithography process is carried out in a so-called projection exposure apparatus having an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process.

One problem which arises in practice is that, in particular as a result of the absorption of the radiation emitted by the EUV light source, the EUV mirrors heat up and thus undergo an associated thermal expansion or the deformation, which in turn can negatively affect the imaging properties of the optical system. This is the case in particular if illumination settings with comparatively small illumination poles are used (e.g. in dipole or quadrupole illumination settings), in which the mirror warming or deformation varies strongly over the optically effective surface of the mirror.

Variations in gravity in dependence on the placement site or the geographic location of the system, for example, are another cause of aberrations occurring during aberration of a projection exposure apparatus.

It is in particular known, for at least partially compensating the above-described problems and also generally for increasing the image position accuracy and image quality (both along the optical axis, or in the light propagation direction, but also in the lateral direction, or perpendicular to the optical axis or light propagation direction), to design one or more mirrors in an EUV system as an adaptive mirror with an actuator layer made of a piezoelectric material, wherein an electric field of locally varying strength is generated across the piezoelectric layer by applying an electric voltage to electrodes arranged on both sides of the piezoelectric layer. In the case of a local deformation of the piezoelectric layer, the reflection layer stack of the adaptive mirror also deforms, with the result that (possibly also temporally variable) imaging aberrations can be compensated for at least partially by appropriately controlling the electrodes.

FIG. 4 shows a construction of a conventional adaptive mirror 30, which is possible in principle, in a merely schematic illustration. The mirror 30 having the optically effective surface 31 has between a mirror substrate 32 and a reflection layer stack 41 (for example as a multilayer system made of molybdenum and silicon layers) a piezoelectric layer 36 which is produced from a piezoelectric material, such as for example lead zirconate titanate ($Pb(Zr,Ti)O_3$). The mirror substrate material can be, for example, quartz glass doped with titanium dioxide ($TiO_2$), with examples of materials that are usable being those sold under the trade names ULE® (by Corning Inc.) or Zerodur® (by Schott AG). The piezoelectric layer 36 is arranged between a first electrode 34, which according to FIG. 4 is applied to an adhesive layer 33 (in the example made of $TiO_2$) provided on the mirror substrate 32, and a second structured electrode 38, wherein another adhesive layer 35 and 37 (in the example made of $LaNiO_3$) is disposed between the electrodes 34 and 38 and the piezoelectric layer 36. The adhesive layer 35 and 37 serves to make available crystalline growth conditions for the piezoelectric layer that are as optimal as possible.

According to FIG. 4, a screening layer 40 (which in the example is made from platinum (PT) just like the electrodes 34, 38 and which is optional in principle) is furthermore disposed on the bottom side of the reflection layer stack 41, which faces the structured electrode 38. According to FIG. 4, a $SiO_2$ layer 39 is furthermore disposed between the piezoelectric layer 36 and the screening layer 40. By applying a locally varying electric voltage, a locally varying deflection of the piezoelectric layer 36 can be produced, which in turn converts into a deformation of the reflection layer stack 41 and thus into a wavefront change for light that is incident on the optically effective surface 31 and which can be used for aberration correction.

Even though the above-described principle of an adaptive mirror makes efficient aberration correction in conjunction with the deformation or actuation of the mirror 30 possible to some degree, the requirement of greater actuations or deformations brings about the problem that the displacement distances that are realizable through deflection of the piezoelectric layer are limited in principle.

One reason for this limitation of the realizable displacement distances is based on the principle thickness limitation of the piezoelectric layer, which is a result of the fact that the piezoelectric material grows on a crystalline structure which is no longer sufficiently perfect if a specific thickness (which for example in the case of lead zirconate titanate as the piezoelectric material can be approximately 2 µm) is exceeded, which ultimately results in a reduction of the so-called "$d_{33}$ coefficient" that is characteristic of the voltage-induced expansion of the piezomaterial and thus also in a decrease of the actuation effect for the deformation of the mirror. The $d_{33}$ coefficient is here defined by $$\Delta D = d_{33} * U \tag{1},$$

$\Delta D$ designating the (absolute) thickness change and U designating the electric voltage.

Furthermore, an increase of the electric voltage applied to the electrodes in the region of the piezoelectric layer, which increase is likewise to be considered for realizing greater displacement distances, is likewise subject to limits, which is due both to hysteresis effects occurring in the piezomaterial when stronger electric fields are applied or electric voltages of more than 20 V are applied, and to damages to the piezoelectric layer in case the electric voltage increases too much and a resulting decrease in service life.

Regarding the prior art, reference is only made by way of example to DE 10 2011 081 603 A1.

SUMMARY

It is an object of the present invention to provide a mirror, in particular for a microlithographic projection exposure apparatus, which makes deformation or actuation via the displacement distances required for example for aberration correction possible, while avoiding the abovementioned problems.

A mirror according to the invention has an optically effective surface as well as:

a mirror substrate, a reflection layer stack that reflects electromagnetic radiation that is incident on the optically effective surface, at least two piezoelectric layers, which are arranged successively between the mirror substrate and the reflection layer stack in the stack direction of the reflection layer stack and to which an electric field can be applied to produce a locally variable deformation, and at least one intermediate layer made of crystalline material and arranged between the piezoelectric layers;

wherein the intermediate layer is configured to leave an electric field, which is present in the region of the piezoelectric layers that adjoin the intermediate layer in the stack direction of the reflection layer stack, substantially uninfluenced.

The mirror can be in particular a mirror for a microlithographic projection exposure apparatus. However, the invention is not limited thereto. In other applications, a mirror according to the invention can also be employed or utilized for example in a system for mask metrology.

The invention makes use in particular of providing not only one but a plurality of (i.e. at least two) piezoelectric layers for realizing a greater displacement distance during the actuation and deformation of an adaptive mirror and of separating the layers in each case by a suitable intermediate layer (or "buffer layer") made of crystalline material.

It is possible in this manner to benefit from the deformation or the displacement distance of each of the piezoelectric layers when the mirror is actuated, with the result that, with respect to the total displacement distance attained, a correspondingly multiplied effect is brought about on the basis of the contribution of all piezoelectric layers. What is achieved here by the intermediate layer that is present according to the invention in each case between two piezoelectric layers is that the piezoelectric layer that follows, in each case in terms of the layer stack sequence, or adjoins the intermediate layer again grows correctly or under optimum growth conditions (with provision of the crystalline intermediate layer with a suitable crystal orientation) and, as a result, the previously described problem of disturbed growth of the piezoelectric layer in the case of a greater thickness is avoided.

In embodiments of the invention, the intermediate layer is furthermore designed such that it leaves an electric field, which is present in the region of the piezoelectric layers that adjoin the intermediate layer in the stack direction of the reflection layer stack, in each case substantially uninfluenced. In other words, if an electric voltage is applied to the electrodes that are present above and below the sequence of piezoelectric layers, the same electric field strength penetrates the relevant piezoelectric layers substantially locally, which in each case undergo a deflection that is proportional to the electric field strength with the result that, in sum, the above described multiplied effect is attained (that is to say, instead of just one deflection, a plurality of deflections, corresponding to the number of piezoelectric layers, take place as a result of the applied electric field). The respective intermediate layer or "buffer layer" is here in each case designed such that the present electric field penetrates the relevant intermediate layer in unattenuated form and without deflection and reaches the respectively adjoining piezoelectric layer.

The disclosure furthermore relates to a mirror, the mirror having an optically effective surface, and the mirror has:

a mirror substrate, a reflection layer stack for reflecting electromagnetic radiation that is incident on the optically effective surface, and at least two piezoelectric layers, which are arranged successively between mirror substrate and reflection layer stack in the stack direction of the reflection layer stack and to which an electric field can be applied to produce a locally variable deformation, wherein at least one intermediate layer made of crystalline material is arranged between the piezoelectric layers.

According to one embodiment, the intermediate layer is made from an electrically insulating material.

The piezoelectric layers can in particular have in each case a thickness of less than 3.0 µm, furthermore in particular a thickness ranging from 1 µm to 2 µm.

According to one embodiment, the mirror is designed for an operating wavelength of less than 30 nm, in particular less than 15 nm. However, the invention is not limited thereto, and the invention can therefore also be realized advantageously in further applications in an optical system having an operating wavelength in the VUV range (for example of less than 200 nm).

The invention furthermore relates to an optical system of a microlithographic projection exposure apparatus, in particular an illumination device or a projection lens, with at least one mirror having the above-described features, and also to a microlithographic projection exposure apparatus.

Further configurations of the invention can be gathered from the description and the dependent claims.

The invention is explained in greater detail below on the basis of exemplary embodiments illustrated in the accompanying figures.

DETAILED DESCRIPTION

Figure 1:
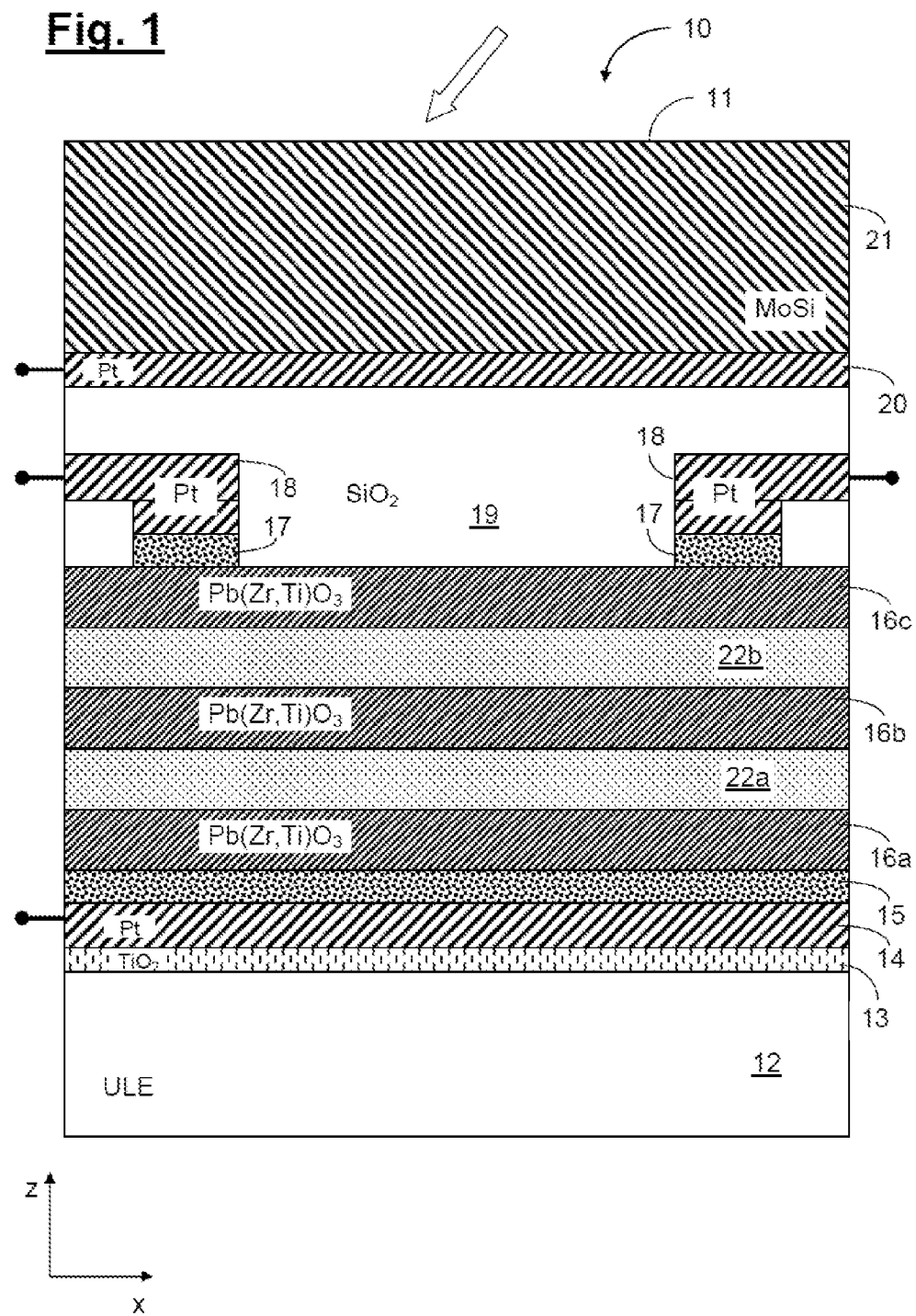
FIG. 1 shows a schematic illustration for elucidating the construction of an adaptive mirror according to one embodiment of the invention.

FIG. 1 shows a schematic illustration for elucidating the construction of a mirror according to the invention in one embodiment of the invention. The mirror 10 comprises in particular a mirror substrate 12, which is made from any desired suitable mirror substrate material. Suitable mirror substrate materials are e.g. quartz glass doped with titanium dioxide ($TiO_2$), with materials that are usable being, merely by way of example (and without the invention being restricted thereto), those sold under the trade names ULE® (by Corning Inc.) or Zerodur® (by Schott AG).

Furthermore, the mirror 10 has, in a manner known per se in principle, a reflection layer stack 21, which, in the embodiment illustrated comprises merely by way of example a molybdenum-silicon (Mo—Si) layer stack. Without the invention being restricted to specific configurations of this layer stack, one suitable construction that is merely by way of example can comprise approximately 50 plies or layer packets of a layer system comprising molybdenum (Mo) layers having a layer thickness of in each case 2.4 nm and silicon (Si) layers having a layer thickness of in each case 3.4 nm.

The mirror 10 can be in particular an EUV mirror of an optical system, in particular of the projection lens or of the illumination device of a microlithographic projection exposure apparatus.

The impingement of electromagnetic EUV radiation (indicated by an arrow in FIG. 1) on the optically effective surface 11 of the mirror 10 during operation of the optical system leads to an inhomogeneous volume change of the mirror substrate 12 due to the temperature distribution which results from the absorption of the radiation which impinges inhomogeneously on the optically effective surface 11.

In the exemplary embodiment of FIG. 1, the mirror 10 according to the invention has, in the stack direction of the reflection layer stack 21 (i.e. in the z-direction with respect to the plotted coordinate system) three piezoelectric layers 16a, 16b, 16c, between which in each case an intermediate layer 22a and 22b made of crystalline material (crystalline quartz in the example) is arranged. The piezoelectric layers 16a, 16b, 16c are produced in the exemplary embodiment from lead zirconate titanate (Pb(Zr,Ti)O$_3$, PZT) and can have an exemplary thickness for example ranging from 1 µm to 2 µm.

The invention is not restricted to the previously mentioned materials and thicknesses, and the piezoelectric layers 16a, 16b, 16c and the intermediate layers 22a, 22b can therefore also be made from different materials which are suitably matched to one another. The crystal orientation of the crystalline intermediate layer(s) 22a, 22b should here in each case be selected such that growth conditions are provided which are in each case optimum for the piezoelectric layer 16b and 16c that follows in the stack direction or z-direction.

Material that can be used for the intermediate layer is, for example, calcium niobate (CaNbO$_3$). This material comprising a perovskite structure can grow in a few nanolayers in the [001] crystal direction. First, a chemical suspension of the material is produced here, in which the substrate is immersed. Annealing at approximately 100° C. brings the layer into its crystalline final state. As a result of a comparatively low lattice mismatch of ca. 4.4% between the CaNbO$_3$ layer (lattice parameters a=0.3853 nm, b=0.3868 nm and c=2.947 nm) and the subsequent lead zirconate titanate layer ((Pb(Zr,Ti)O$_3$, PZT) (lattice parameters a=b=0.403 nm and c=0.410 nm)), growth of the PZT layer in the desired [001] direction is ensured. As a result of the thickness of the CaNbO$_3$ layer of only a few nanometers (nm), the layer is not electrically conductive. An electric field can penetrate unimpeded and thus act on piezoelectric layers which are separated from one another by intermediate layers.

A material which can be used as an alternative to the intermediate layer is strontium titanate (SrTiO$_3$, STO), which can be applied for example by way of pulsed laser deposition (PLD). This material likewise crystallizes in a perovskite structure and grows, among others, in the desired crystal direction [001]. The lattice parameter being a=0.3905 nm. Compared to the PZT layer, the lattice mismatch is here merely approximately 2%, which makes possible an almost perfect crystalline growth of the piezoelectric layer on strontium titanate. Strontium titanate is additionally an electric insulator having a dielectric constant of approximately 300.

In other embodiments, the mirror 10 can also have just two piezoelectric layers which are separated from one another by an intermediate layer, or four or more piezoelectric layers which are separated in each case by an intermediate layer.

According to FIG. 1, in each case one electrode 14 and 18 (made from platinum in the exemplary embodiment) is located above and below the previously described sequence of piezoelectric layers 16a, 16b, 16c, wherein an electric voltage can be applied to these electrodes 14 and 18 in order to subject the piezoelectric layers 16a, 16b, 16c to an electric field which varies locally, if appropriate. The upper electrode 18 facing the reflection layer stack 21 is suitably structured to generate this locally (in particular the lateral direction with respect to the stack direction or z-direction, i.e. within the x-y-plane) varying electric field.

Reference numerals "15" and "17" in each case designates an adhesive layer for the relevant electrode 14 and 18 for improved adhesion to the respectively adjoining piezoelectric layer 16a and 16c, wherein these adhesive layers can consist, for example, of lanthanum nickel oxide (LaNiO$_3$). The mirror 10 according to FIG. 1 furthermore has an adhesive layer 13 (in the example made of titanium dioxide, TiO$_2$) between the mirror substrate 12 and the lower electrode 14 that faces the mirror substrate 12.

Reference numeral "20" in FIG. 1 designates a screening layer (in the example made of platinum), which is arranged on the bottom side of the reflection layer stack 21 that faces the electrodes 14 and 18 and can be grounded. This screening layer 20, however, is optional in principle, and in other embodiments, the reflection layer stack 21 itself can thus be grounded or connected to ground.

During operation of the mirror 10 or of an optical system comprising this mirror 10, the application of an electric voltage to the electrodes 14 and 18 results in a deflection of the piezoelectric layers 16a, 16b, 16c via the electric field which is brought about in the region of the piezoelectric layers 16a, 16b, 16c, wherein the displacement distance which is attained overall is the result of the sum of the individual displacement distances of each individual piezoelectric layer 16a, 16b, 16c. It is possible in this way (for example for compensating optical aberrations, for example as a result of thermal deformations in the case of EUV radiation impinging on the optically effective surface 11) to achieve actuation of the mirror with correspondingly greater displacement distances (which can range, merely by way of example, from 10 nm to 20 nm).

Owing to the fact that each of the piezoelectric layers 16a, 16b, 16c contributes to this total deflection, the attained, comparatively large displacement distances can be achieved with a comparatively moderate electric voltage present at the electrodes 14 and 18, with the result that hysteresis effects, for example, in the piezoelectric layers 16a, 16b, 16c can be avoided.

Figure 2:
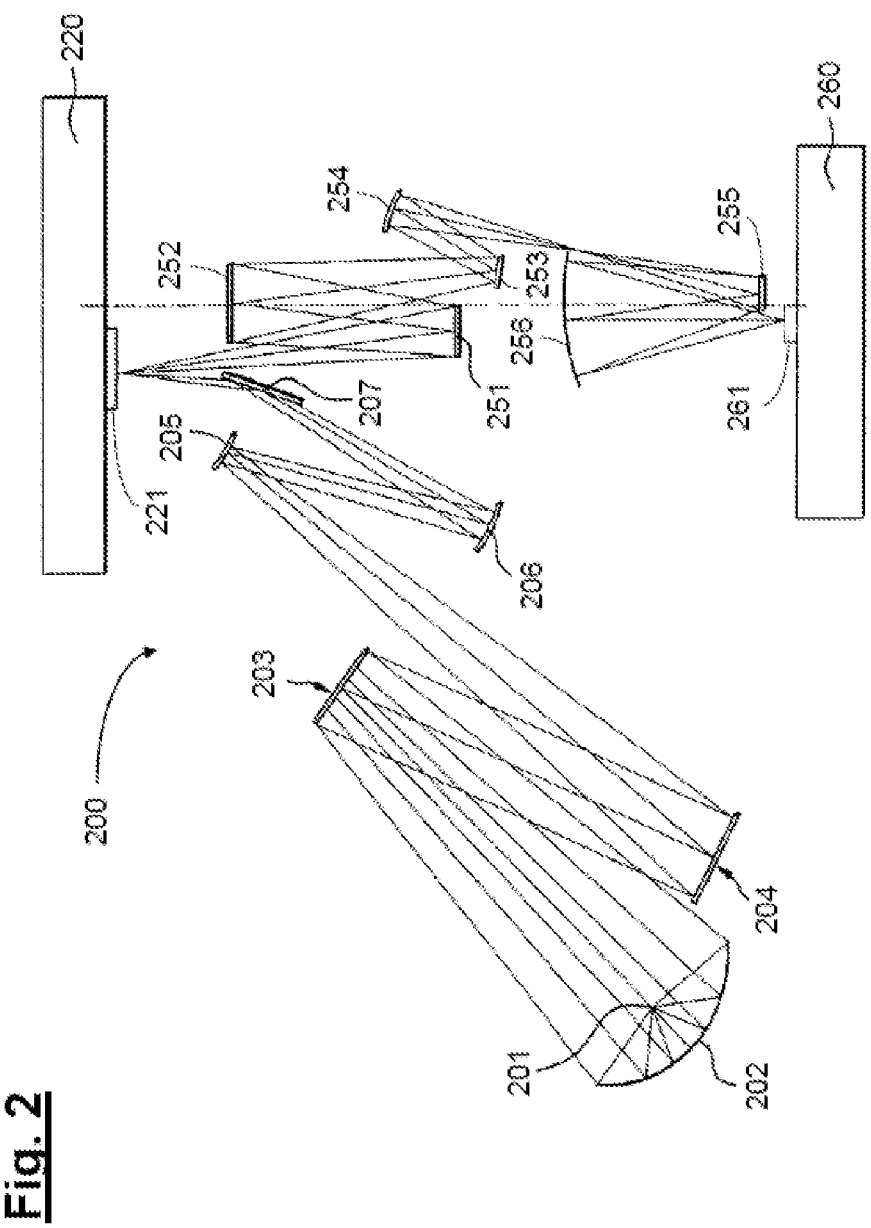
FIGS. 2-3 show schematic illustrations for elucidating the possible construction of a microlithographic projection exposure apparatus designed for operation in EUV.

FIG. 2 shows a schematic illustration of one exemplary projection exposure apparatus which is designed for operation in the EUV and in which the present invention can be realized. In accordance with FIG. 2, an illumination device in a projection exposure apparatus 200 designed for EUV comprises a field facet mirror 203 and a pupil facet mirror 204. The light from a light source unit comprising a plasma light source 201 and a collector mirror 202 is directed onto the field facet mirror 203. A first telescope mirror 205 and a second telescope mirror 206 are arranged in the light path downstream of the pupil facet mirror 204. A deflection mirror 207 is arranged downstream in the light path, the deflection mirror directing the radiation impinging on it onto an object field in the object plane of a projection lens comprising six mirrors 251-256. A reflective structure-bearing mask 221 on a mask stage 220 is arranged at the location of the object field, the mask being imaged into an image plane with the aid of the projection lens, in which image plane is situated a substrate 261 coated with a light-sensitive layer (photoresist) on a wafer stage 260.

Of the mirrors 251-256 of the projection lens, it is in particular the mirrors 251 and 252—arranged in the starting area of the projection lens with respect to the optical beam path—that can be designed in the manner according to the invention, since the attained effect of compensating for thermal deformation is particularly noticeable at the mirrors 251, 252 when the comparatively low reflection losses, and thus the relatively high light intensities, are added together.

Figure 3:
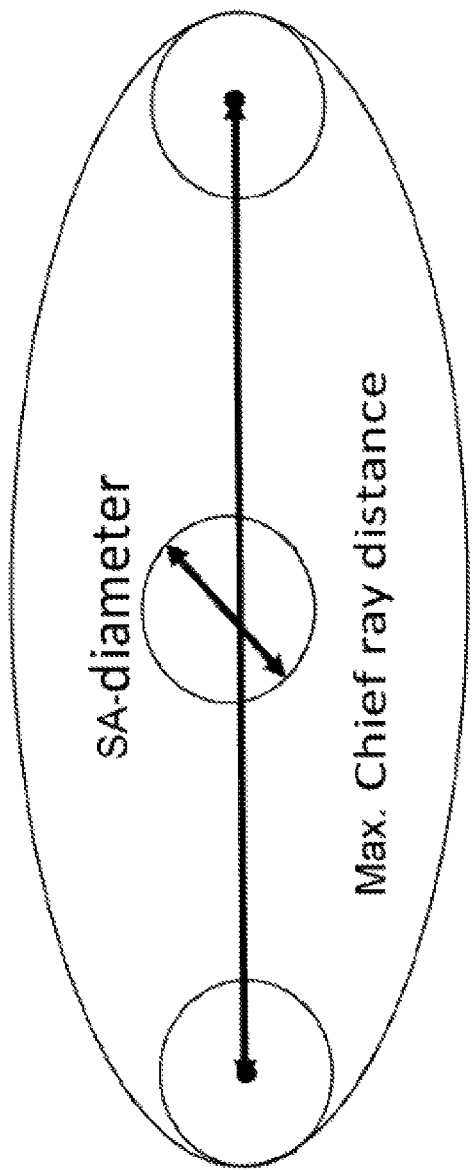
Figure 4:
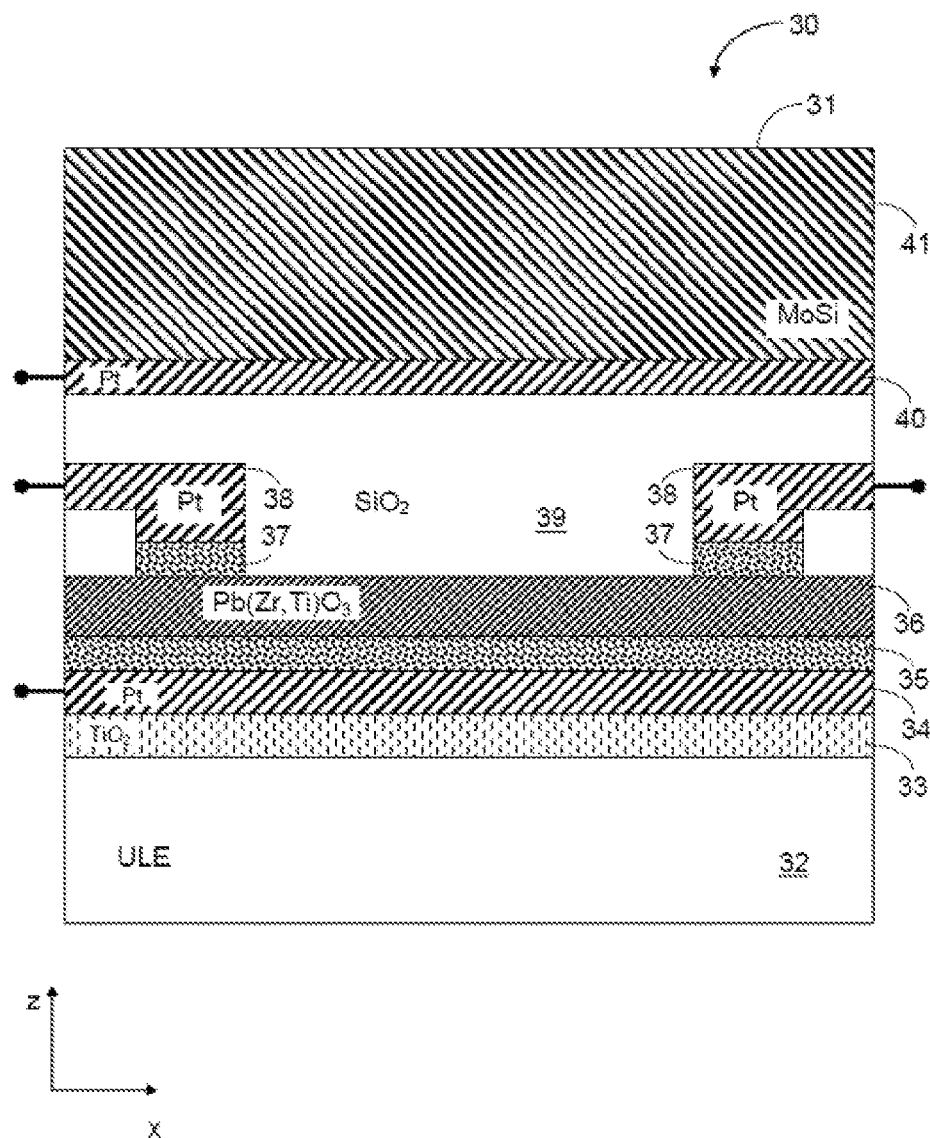
FIG. 4 shows a schematic illustration for elucidating a conventional adaptive mirror.

The invention is however not restricted to application to the mirrors 251, 252, such that in principle other mirrors can also be designed in the manner according to the invention, in particular mirrors in pupil or field proximity. According to FIG. 3 (as described, for example, in US 2008/0165415 A1), the pupil or field proximity can be described quantitatively by a parameter P(M), the parameter P(M) being defined as $$P(M) = \frac{D(SA)}{D(SA) + D(CR)}, \quad (2)$$

with D(SA) designating the subaperture diameter and D(CR) designating the maximum chief ray distance (from all field points or defined over all field points of the optically used field) on the optical surface M in the relevant plane. As a result, for a field mirror (having a subaperture diameter of 0), P(M)=0, and for a pupil mirror (having a chief ray distance of 0) P(M)=1. The above-mentioned mirror 10 can be located, for example, as a pupil-near mirror in a plane of the projection lens, in which the parameter P(M) is at least 0.8, in particular at least 0.9. The mirror 10 can furthermore be located as a field-near mirror, for example, in a plane of the projection lens, in which the parameter P(M) is at most 0.2, in particular at most 0.1.

Even though the invention has been described on the basis of specific embodiments, numerous variations and alternative embodiments are evident to the person skilled in the art, e.g. through combination and/or exchange of features of individual embodiments. Accordingly, for the person skilled in the art, such variations and alternative embodiments are concomitantly encompassed by the present invention, and the scope of the invention is restricted only within the meaning of the appended patent claims and equivalents thereof.

What is claimed is:

1. A mirror having an optically effective surface, comprising
   a mirror substrate;
   a reflection layer stack configured to reflect electromagnetic radiation that is incident on the optically effective surface;
   at least a first and a second piezoelectric layer, which are arranged successively between the mirror substrate and the reflection layer stack in a stack direction of the reflection layer stack and configured to receive an electric field to produce a locally variable deformation in the piezoelectric layers; and
   at least one intermediate layer of crystalline material arranged between the first and the second piezoelectric layers;
   wherein the intermediate layer has substantially no influence on the electric field applied in a region of the piezoelectric layers that adjoin the intermediate layer in the stack direction of the reflection layer stack, and
   wherein the first piezoelectric layer, the intermediate layer and the second piezoelectric layer are arranged between a first electrode and a second electrode, wherein the first electrode and the second electrode are configured to apply the electric field through the first piezoelectric layer, the intermediate layer and the second piezoelectric layer.

2. The mirror as claimed in claim 1, wherein the mirror has at least three piezoelectric layers, which are arranged successively between the mirror substrate and the reflection layer stack in the stack direction of the reflection layer stack.

3. The mirror as claimed in claim 1, wherein the piezoelectric layers each have a thickness of less than 3.0 μm.

4. The mirror as claimed in claim 3, wherein the piezoelectric layers each have a thickness ranging from 1 μm to 2 μm.

5. The mirror as claimed in claim 1 and configured for an operating wavelength of less than 30 nm.

6. The mirror as claimed in claim 5 and configured for an operating wavelength of less than 15 nm.

7. The mirror as claimed in claim 1 and configured for a microlithographic projection exposure apparatus.

8. An optical system having a mirror as claimed in claim 1.

9. The optical system as claimed in claim 8, wherein the mirror is arranged in a plane, in which a parameter P(M), which is defined as $$P(M) = \frac{D(SA)}{D(SA) + D(CR)},$$

is at least 0.8, with D(SA) designating a subaperture diameter and D(CR) designating a maximum chief ray distance over all field points of the optically used field on the optical surface M in the relevant plane.

10. The optical system as claimed in claim 8, wherein the mirror is arranged in a plane, in which a parameter P(M), which is defined as $$P(M) = \frac{D(SA)}{D(SA) + D(CR)},$$

is at most 0.2, with D(SA) designating a subaperture diameter and D(CR) designating a maximum chief ray distance over all field points of the optically used field on the optical surface M in the relevant plane.

11. A microlithographic projection exposure apparatus comprising an illumination device and a projection lens, the projection exposure apparatus having an optical system as claimed in claim 8.

12. The optical system as claimed in claim 8 and configured as an illumination device or a projection lens of a microlithographic projection exposure apparatus.

13. A mirror having an optically effective surface, comprising
- a mirror substrate;
- a reflection layer stack configured to reflect electromagnetic radiation that is incident on the optically effective surface;
- at least a first and a second piezoelectric layer, which are arranged successively between the mirror substrate and the reflection layer stack in a stack direction of the reflection layer stack and configured to receive an electric field to produce a locally variable deformation in the piezoelectric layers; and
- at least one intermediate layer of crystalline material arranged between the first and the second piezoelectric layers;
- wherein the intermediate layer has substantially no influence on an electric field applied in a region of the piezoelectric layers that adjoin the intermediate layer in the stack direction of the reflection layer stack, and wherein the crystalline material is selected from the group consisting of crystalline quartz ($SiO_2$), calcium niobate ($CaNbO_3$) and strontium titanate ($SrTiO_3$).

14. The mirror as claimed in claim 13, wherein the piezoelectric layers each have a thickness of less than 3.0 µm.

15. The mirror as claimed in claim 13 and configured for an operating wavelength of less than 30 nm.

16. The mirror as claimed in claim 13 and configured for a microlithographic projection exposure apparatus.

17. A mirror having an optically effective surface, comprising
- a mirror substrate;
- a reflection layer stack configured to reflect electromagnetic radiation that is incident on the optically effective surface;
- at least a first and a second piezoelectric layer, which are arranged successively between the mirror substrate and the reflection layer stack in a stack direction of the reflection layer stack and configured to receive an electric field to produce a locally variable deformation in the piezoelectric layers; and
- at least one intermediate layer of crystalline material arranged between the first and the second piezoelectric layers;
- wherein the intermediate layer has substantially no influence on an electric field applied in a region of the piezoelectric layers that adjoin the intermediate layer in the stack direction of the reflection layer stack, and wherein the at least one intermediate layer is made from electrically insulating material.

18. The mirror as claimed in claim 17, wherein the piezoelectric layers each have a thickness of less than 3.0 µm.

19. The mirror as claimed in claim 17 and configured for an operating wavelength of less than 30 nm.

20. The mirror as claimed in claim 17 and configured for a microlithographic projection exposure apparatus.

* * * * *